United States Patent
Forrai et al.

(10) Patent No.: US 8,338,200 B2
(45) Date of Patent: Dec. 25, 2012

(54) FRONTSIDE-ILLUMINATED INVERTED QUANTUM WELL INFRARED PHOTODETECTOR DEVICES AND METHODS OF FABRICATING THE SAME

(75) Inventors: David Forrai, Centerville, OH (US); Darrel Endres, West Chester, OH (US); Robert Jones, Cincinnati, OH (US); Michael James Garter, Lebanon, OH (US)

(73) Assignee: L-3 Communications Cincinnati Electronics Corporation, Mason, OH (US)

(*) Notice: Subject to any disclaimer, the term of this patent is extended or adjusted under 35 U.S.C. 154(b) by 97 days.

(21) Appl. No.: 13/019,658

(22) Filed: Feb. 2, 2011

(65) Prior Publication Data

US 2012/0193608 A1 Aug. 2, 2012

(51) Int. Cl.
*H01L 21/00* (2006.01)
*H01L 31/0232* (2006.01)
*H01S 5/00* (2006.01)

(52) U.S. Cl. .......... 438/29; 438/31; 438/40; 438/57; 438/66; 372/43.01; 372/46.01; 372/50.124; 257/14; 257/21; 257/103; 257/184; 257/186; 257/E31.022; 257/E31.032; 257/E31.038

(58) Field of Classification Search .......... 438/29, 438/31, 40, 57, 66; 372/43.01, 46.01, 50.124; 257/14, 21, 103, 184, 185, E31.022, E31.032, 257/E31.038
See application file for complete search history.

(56) References Cited

U.S. PATENT DOCUMENTS

| | | | |
|---|---|---|---|
| 4,695,861 A | 9/1987 | Paine et al. | |
| 5,227,656 A | 7/1993 | Timlin et al. | |
| 5,304,500 A * | 4/1994 | Timlin et al. | 438/66 |
| 6,028,323 A | 2/2000 | Liu | |
| 6,204,088 B1 | 3/2001 | White et al. | |
| 6,359,283 B1 | 3/2002 | Gordon et al. | |
| 6,410,917 B1 | 6/2002 | Choi | |
| 6,561,693 B1 | 5/2003 | Martin | |
| 7,129,104 B2 * | 10/2006 | Gunapala et al. | 438/29 |
| 7,268,371 B2 * | 9/2007 | Krames et al. | 257/98 |
| 7,291,858 B2 | 11/2007 | Sundaram et al. | |
| 7,307,290 B2 | 12/2007 | Iwasaki et al. | |
| 7,315,560 B2 * | 1/2008 | Lewis et al. | 372/50.124 |
| 7,479,401 B2 | 1/2009 | Lai et al. | |
| 7,566,875 B2 | 7/2009 | Starikov et al. | |
| 7,608,830 B1 | 10/2009 | Kinch | |
| 7,777,186 B2 * | 8/2010 | Endres et al. | 250/332 |
| 2009/0032894 A1 | 2/2009 | Maryfield et al. | |
| 2009/0072144 A1 | 3/2009 | Krishna et al. | |
| 2012/0012816 A1 * | 1/2012 | Choi | 257/14 |

FOREIGN PATENT DOCUMENTS

JP 2009164302 A 7/2009

* cited by examiner

*Primary Examiner* — Dao H Nguyen
(74) *Attorney, Agent, or Firm* — Dinsmore & Shohl LLP

(57) ABSTRACT

A method of fabricating a frontside-illuminated inverted quantum well infrared photodetector may include providing a quantum well wafer having a bulk substrate layer and a quantum material layer, wherein the quantum material layer includes a plurality of alternating quantum well layers and barrier layers epitaxially grown on the bulk substrate layer. The method further includes applying at least one frontside common electrical contact to a frontside of the quantum well wafer, bonding a transparent substrate to the frontside of the quantum well wafer, thinning the bulk substrate layer of the quantum well wafer, and etching the quantum material layer to form quantum well facets that define at least one pyramidal quantum well stack. A backside electrical contact may be applied to the pyramidal quantum well stack. In one embodiment, a plurality of quantum well stacks is bonded to a readout integrated circuit of a focal plane array.

17 Claims, 11 Drawing Sheets

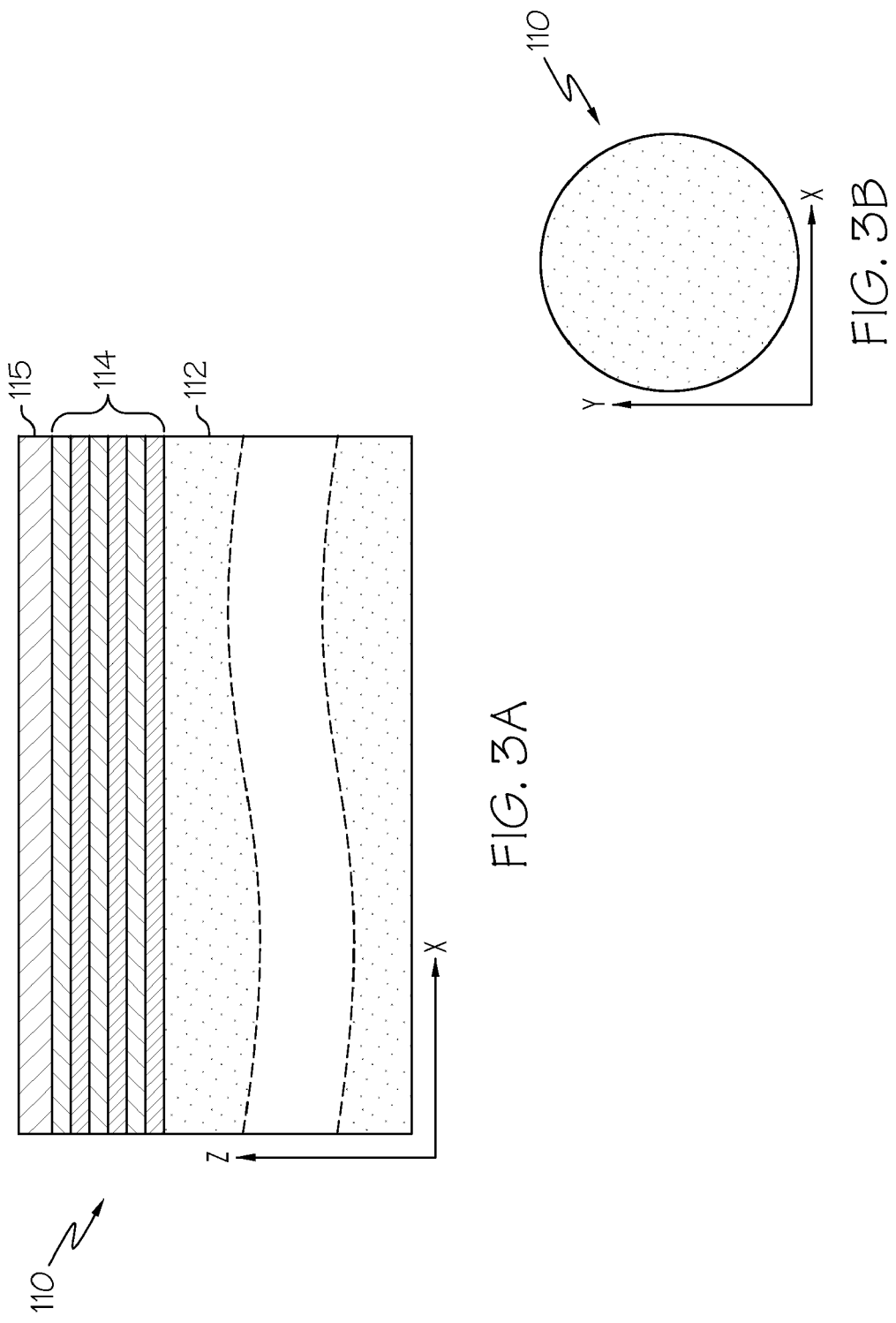

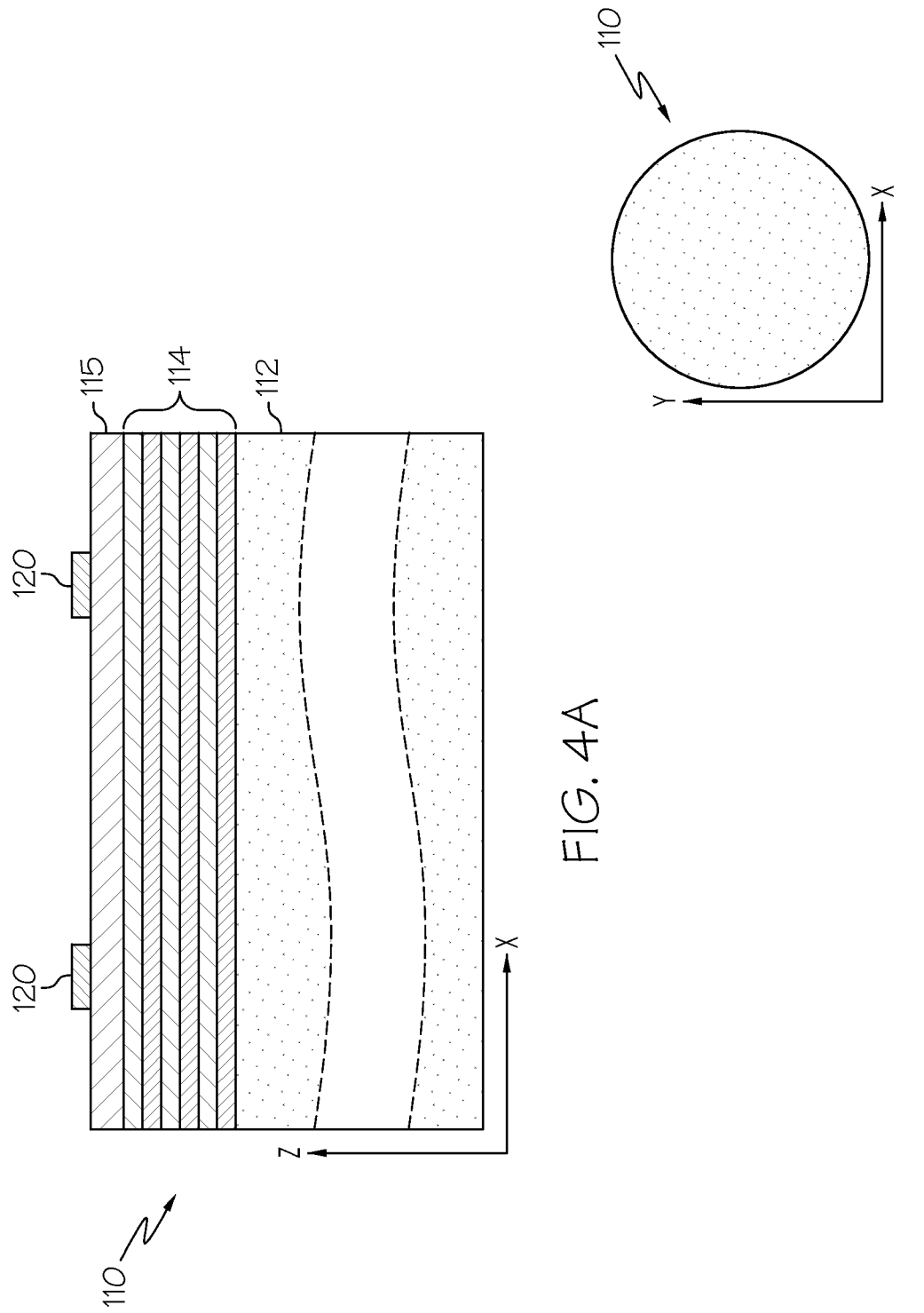

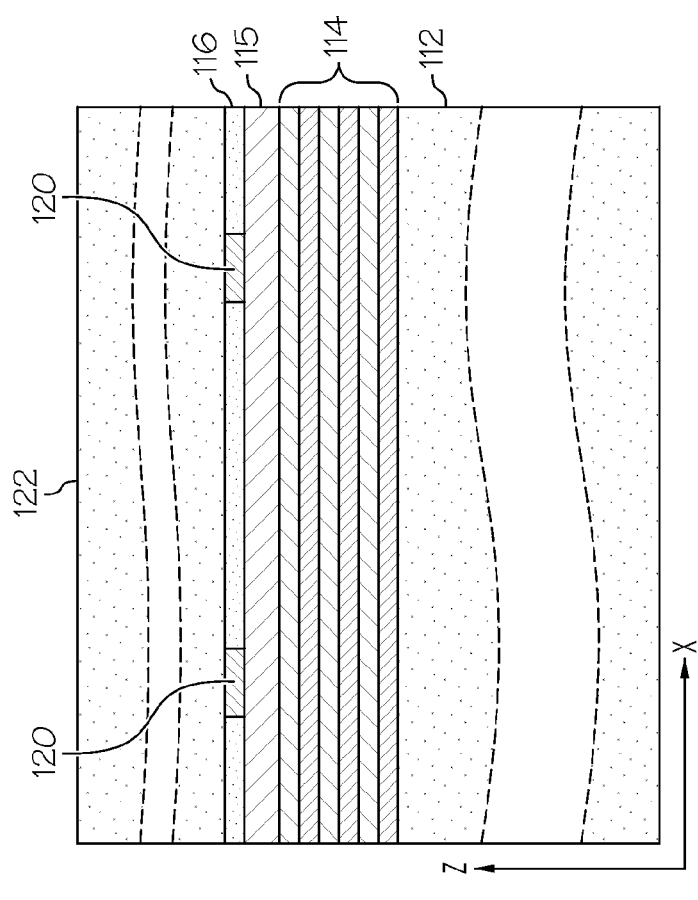
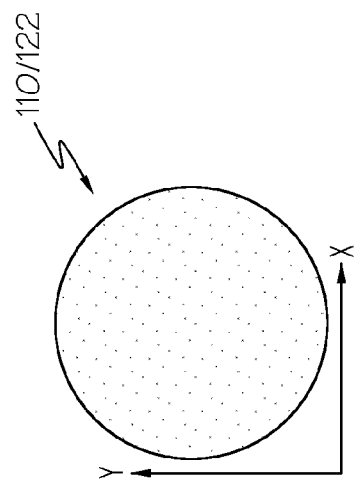

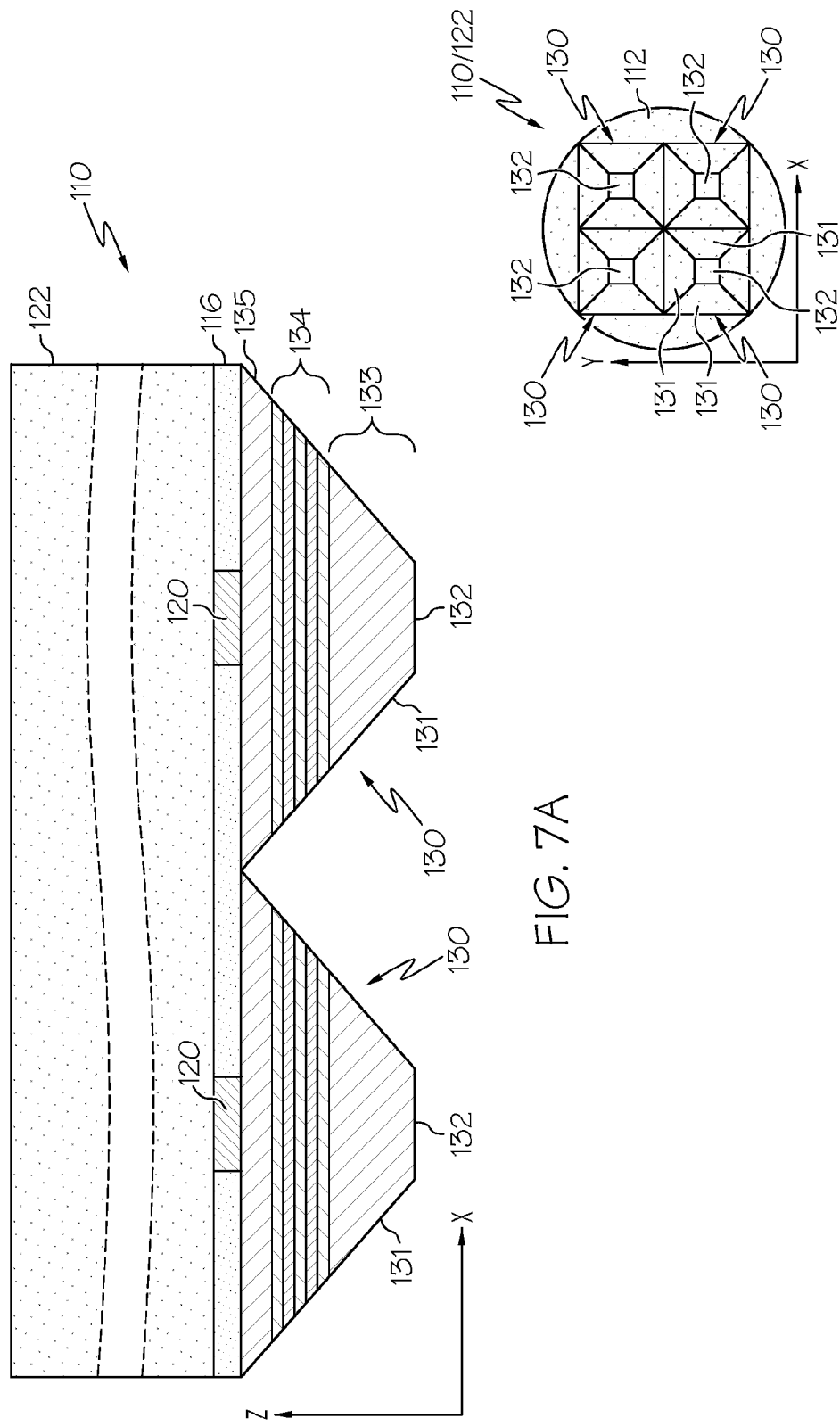

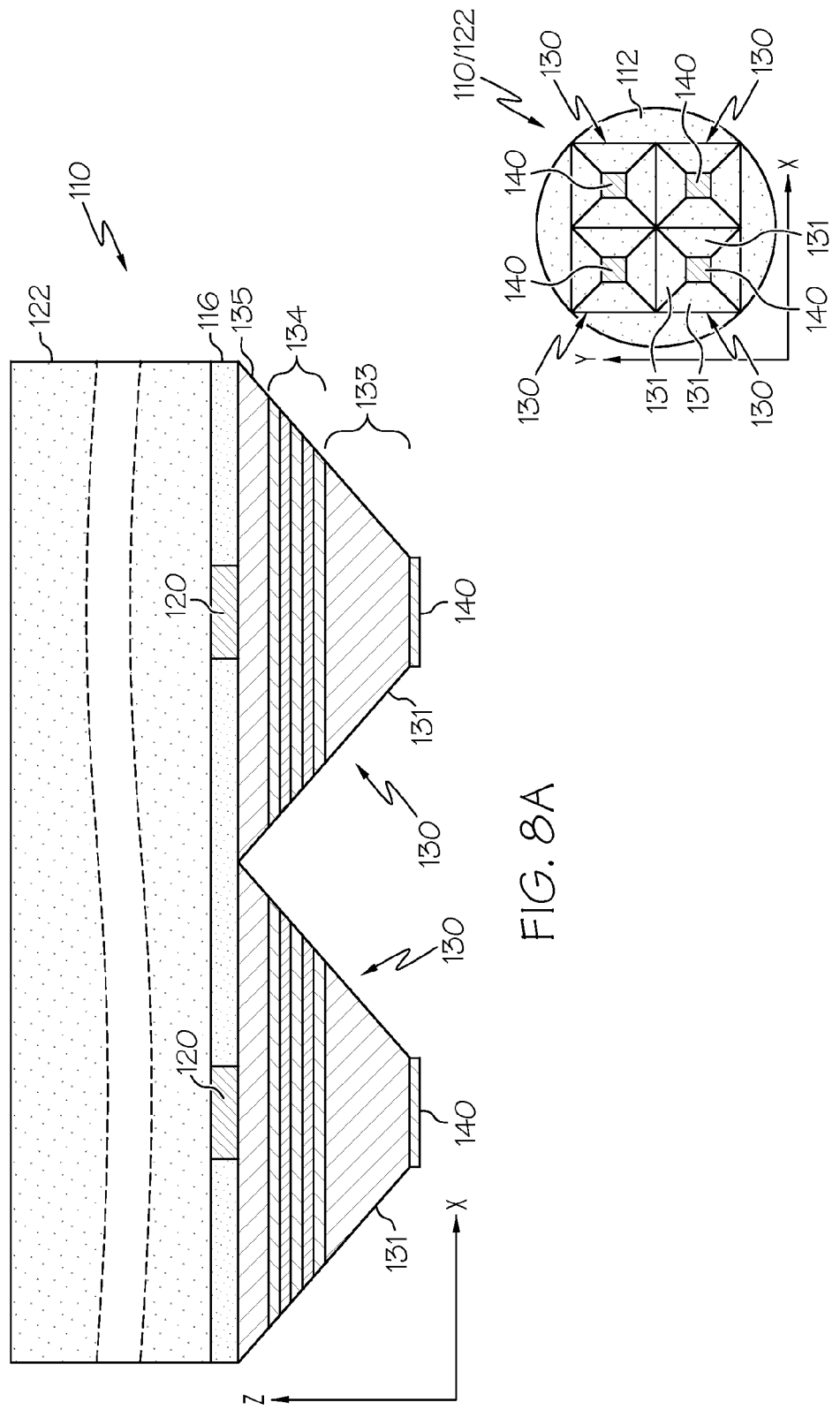

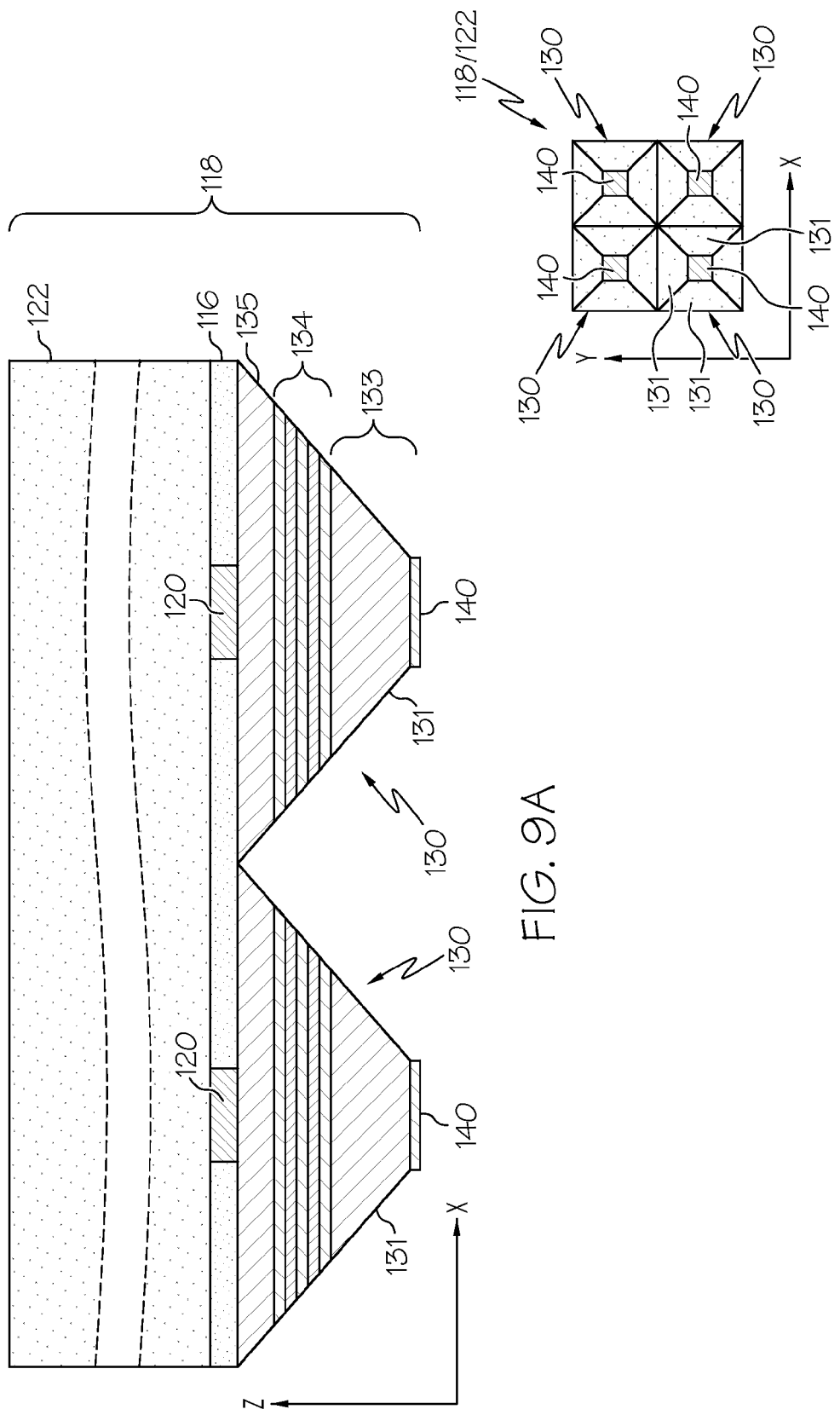

FRONTSIDE-ILLUMINATED INVERTED QUANTUM WELL INFRARED PHOTODETECTOR DEVICES AND METHODS OF FABRICATING THE SAME

TECHNICAL FIELD

Embodiments relate generally to infrared sensors and, more particularly, to inverted quantum well infrared photodetector devices capable of detecting radiation in the infrared spectral range.

BACKGROUND

An infrared focal plane array (FPA) is an imaging sensing apparatus that includes an array of pixels capable of detecting photons in the infrared spectrum. The pixels of infrared FPAs may be formed of a material that is sensitive to infrared radiation, such as indium antimonide (InSb), Mercury Cadium Telluride (MCT), quantum well materials, such as gallium arsenide and aluminum gallium arsenide, or other infrared-sensitive detector materials. In quantum well infrared photodetectors (QWIP), alternating layers of semiconductor materials are stacked between electrical contacts. QWIP devices are photoconductive devices in which electric fields normal to the direction of propagation of the infrared radiation excite electrons in low energy wells of the quantum well material to generate a photocurrent. The quantum well stacks are then bonded to a read-out circuit that receives the photocurrent signals generated by the individual quantum well stacks. A plurality of quantum well stacks act as pixels that may be used to generate an infrared image.

SUMMARY

According to one embodiment, a method of fabricating a frontside-illuminated inverted quantum well infrared photodetector focal plane array includes providing a quantum well wafer having a bulk substrate layer and a quantum material layer, wherein the quantum material layer includes a plurality of alternating quantum well layers and barrier layers. The alternating quantum well layers and barrier layers may have been epitaxially grown on the bulk substrate layer. The quantum material layer is on a frontside of the quantum well wafer, and the bulk substrate layer is on a backside of the quantum well wafer. The method further includes applying a plurality of frontside common electrical contacts to the frontside of the quantum well wafer, bonding a transparent substrate that is transparent to radiation in a predetermined wavelength range to the frontside of the quantum well wafer and the frontside common electrical contacts, thinning the bulk substrate layer of the quantum well wafer, and etching the quantum material layer to form a plurality of quantum well facets that define a plurality of pyramidal quantum well stacks. A backside electrical contact may be applied to each pyramidal quantum well stack to form a plurality of pixels that are at least partially reticulated. The quantum well wafer and the transparent substrate may be singulated into one or more quantum well infrared photodetector arrays that are bump-bonded to a read-out integrated circuit assembly at the backside electrical contacts. The read-out integrated circuit assembly may include a read-out integrated circuit assembly bulk substrate that has a coefficient of thermal expansion that is substantially equal to the coefficient of thermal expansion of the transparent substrate.

According to another embodiment, a method of fabricating a frontside-illuminated inverted quantum well infrared photodetector includes providing a quantum well wafer having a bulk substrate layer and a quantum material layer, wherein the quantum material layer includes a plurality of alternating quantum well layers and barrier layers. The alternating quantum well layers and barrier layers may have been epitaxially grown on the bulk substrate layer. The quantum material layer is on a frontside of the quantum well wafer, and the bulk substrate layer is on a backside of the quantum well wafer. The method further includes applying at least one frontside common electrical contact to the frontside of the quantum well wafer, bonding a transparent substrate to the frontside of the quantum well wafer and the frontside common electrical contact, thinning the bulk substrate layer of the quantum well wafer, and etching the quantum material layer to form quantum well facets that define at least one pyramidal quantum well stack. A backside electrical contact may be applied to the pyramidal quantum well stack to form at least one reticulated pixel.

According to yet another embodiment, a frontside-illuminated inverted quantum well infrared photodetector focal plane array includes a transparent substrate, a plurality of pyramidal quantum well stacks, a plurality of frontside common electrical contacts, a backside electrical contact coupled to a backside of each pyramidal quantum well stack, and a read-out integrated circuit assembly. The pyramidal quantum well stacks may include quantum well facets and a plurality of alternating quantum well layers and barrier layers. Each quantum well stack has a frontside and a backside, wherein the backside of each pyramidal quantum well stack includes a substantially removed substrate layer. The frontside common electrical contacts are coupled to the frontside of the pyramidal quantum well stacks, and the frontside of the plurality of pyramidal quantum well stacks and plurality of frontside common electrical contacts are bonded to the transparent substrate. The backside electrical contacts are coupled to the backside of each pyramidal quantum well stack. The read-out integrated circuit assembly includes a read-out integrated circuit substrate and a plurality of electrical contacts, and is bonded to the backside electrical contacts of the pyramidal quantum well by a plurality of indium bonding bumps.

BRIEF DESCRIPTION OF THE DRAWINGS

The following detailed description will be more fully understood in view of the drawings in which:

FIGS. 3A and 3B depict a schematic illustration quantum well wafer comprising a bulk substrate layer, a quantum material layer and a thin surface layer according to one or more embodiments described and illustrated herein;

FIGS. 4A and 4B depict a schematic illustration of frontside common electrical contacts applied to the quantum well wafer illustrated in FIGS. 3A and 3B according to one or more embodiments described and illustrated herein;

FIGS. 5A and 5B depict a schematic illustration of a transparent substrate bonded to the quantum well wafer and frontside common electrical contacts illustrated in FIGS. 3A-4B according to one or more embodiments described and illustrated herein;

FIGS. 7A and 7B depict a schematic illustration of the quantum well wafer and the transparent substrate illustrated in FIGS. 6A and 6B after the formation of quantum well stacks by an etching process according to one or more embodiments described and illustrated herein;

FIGS. 8A and 8B depict a schematic illustration of the quantum well wafer and the transparent substrate illustrated in FIGS. 7A and 7B after the application of backside electrical contacts to the quantum well stacks according to one or more embodiments described and illustrated herein;

FIGS. 9A and 9B depict a schematic illustration of an inverted quantum well infrared photodetector singulated from the quantum well wafer and the transparent substrate illustrated in FIGS. 8A and 8B according to one or more embodiments described and illustrated herein.

Figure 1:
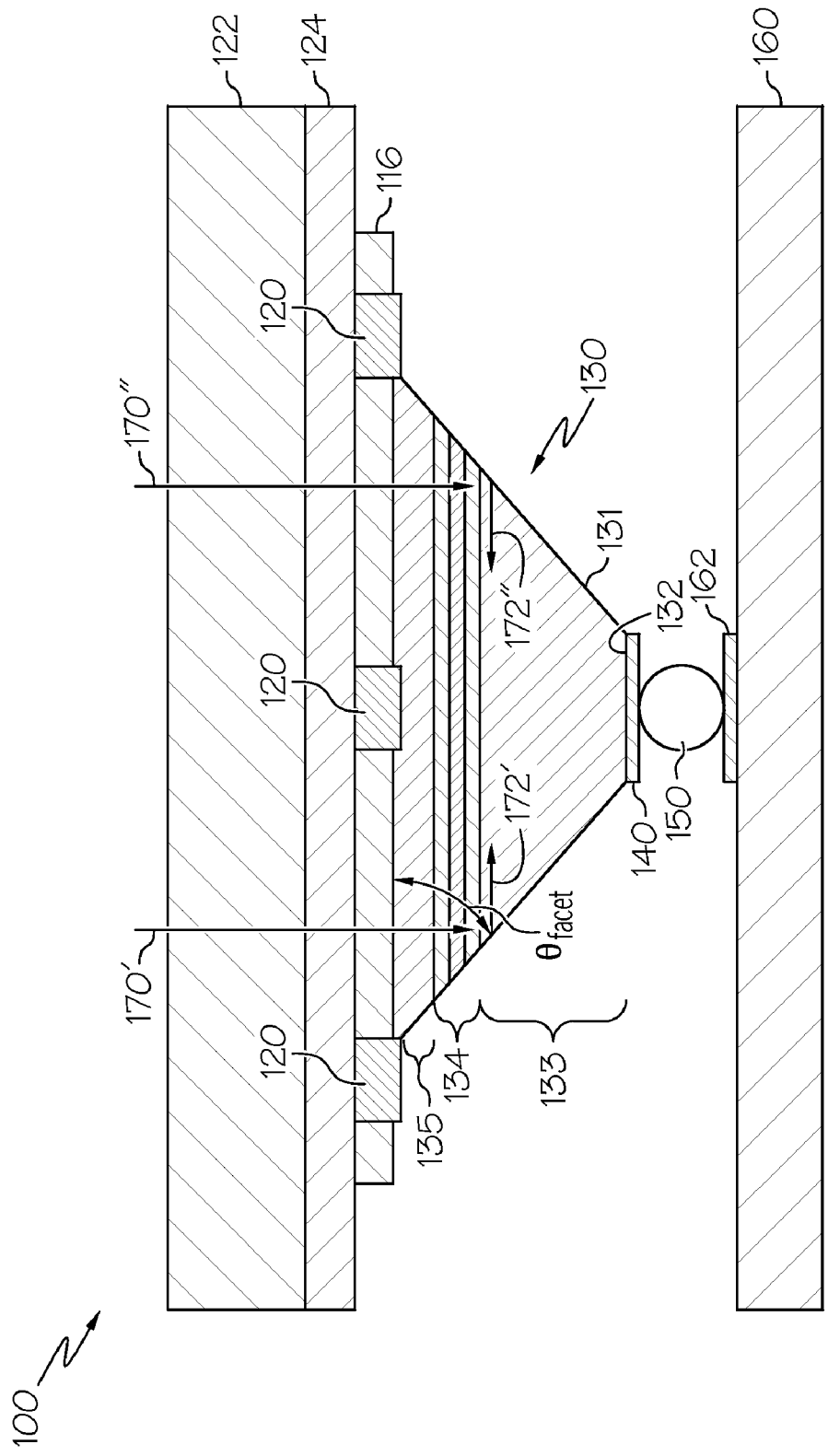
FIG. 1 depicts a schematic illustration of a single quantum well stack within a quantum well infrared photodetector focal plane array according to one or more embodiments described and illustrated herein.

The embodiments set forth in the drawings are illustrative in nature and are not intended to be limiting of the invention defined by the claims. Moreover, individual features of the drawings and the invention will be more fully apparent and understood in view of the detailed description.

DETAILED DESCRIPTION OF ILLUSTRATIVE EMBODIMENTS

Referring generally to the drawings, embodiments of frontside-illuminated, inverted quantum well infrared photodetector (IQWIP) devices and fabrication methods thereof are illustrated. The IQWIP is a photoconductive device that is operable to detect radiation in the infrared and/or near infrared spectrum. The illustrated IQWIP devices generally comprise a transparent substrate, a plurality of frontside common electrical contacts, and a pyramidal quantum well stack. One or more IQWIP devices may be coupled to a readout integrated circuit (ROIC) via bonding bumps, thereby providing an IQWIP focal plane array device having of an array of quantum well pixels. Embodiments of the IQWIP devices described herein are referred to as frontside-illuminated because radiation enters the device at a frontside of the detector array.

Generally, IQWIP devices may be fabricated by thinning a backside of a quantum well wafer. The remaining quantum well wafer, which contains alternating quantum well layers and barrier layers, is etched to form reticulated quantum well stacks that define pixels. Electrical contacts are provided on both the frontside and backside the quantum well wafer to provide electrical connection to a ROIC device for signal interpretation. The frontside illuminated, backside reticulated IQWIP device may provide for a device with relatively low dark current, increased fill factor, increased quantum efficiency, and increased thermal reliability of focal plane arrays incorporating such IQWIP devices. Various embodiments of frontside-illuminated, inverted quantum well infrared photodetector focal plane arrays and methods of fabricating inverted quantum well infrared photodetector devices will be described in more detail herein.

Referring now to FIG. 1, one embodiment of an IQWIP device configured as an IQWIP focal plane array 100 is illustrated. Generally, the illustrated IQWIP focal plane array 100 comprises a transparent substrate 122, an anti-reflective layer 124, frontside common electrical contacts 120, a pyramidal quantum well stack 130, a bonding bump 150, and a ROIC assembly 160. It should be understood that the IQWIP focal plane array 100 may comprise a plurality of quantum well stacks 130 and that only one quantum well stack 130 is illustrated in FIG. 1 for ease of illustration. The transparent substrate 122 comprises a material that is transparent to radiation in the desired wavelength, such as wavelengths in the infrared or near-infrared spectrum. The transparent substrate 122, which may be made of silicon, for example, provides a window or an entry point for radiation (illustrated as arrows 170' and 170") into the IQWIP focal plane array 100. An optional anti-reflective layer 124 may be applied to the transparent substrate 122 to increase the infrared radiation entering the IQWIP focal plane array 100 that is transmitted to the quantum well stack 130.

The plurality of frontside common electrical contacts 120 is positioned between a frontside of the quantum well stack 130 and the transparent substrate 122. The frontside common electrical contacts 120 may be configured as a metal grid that is overlaid on the frontside of the quantum well stack 130, and is made of an electrically conductive material such as gold, for example. The area of the plurality of frontside common electrical contacts is relatively small so as to not block incoming radiation. Although not illustrated in FIG. 1, the frontside common electrical contacts 120 may be positioned on an insulating layer (e.g., an oxide/sulfide layer such as silicon monoxide or zinc sulfide) that is applied to the frontside of the quantum well stack material during fabrication. Therefore, the insulating layer may be located between the frontside common electrical contacts 120 and the quantum well stack 130. The frontside common electrical contacts 120 provide a reference potential (e.g., ground) for the frontside of the quantum well stack 130 and, in the case of a focal plane array comprising an array of quantum well stacks 130, a reference potential for all of the quantum well stacks within the array. The metal grid defining the frontside common electrical contacts 120 may be electrically coupled to a circuit, such as a read-out integrated circuit of the ROIC assembly 160. It should be understood that the frontside common electrical contacts 120 may be configured in an arrangement other than a grid pattern.

The quantum well stack 130 is coupled to the frontside common electrical contacts 120 and the transparent substrate 122. In one embodiment, the quantum well stack 130 is bonded to the transparent substrate 122 via an adhesive bonding layer 116, such as an epoxy adhesive. The adhesive chosen should be suitable for use with cryogenic cooling, such that it does not outgas, deform, crack or otherwise degrade during operation of the IQWIP focal plane array 100. As illustrated in FIG. 1, as well as FIG. 9B, the quantum well stack 130 is pyramidal in shape and comprises facets 131 having a facet angle $\theta_{facet}$.

The illustrated quantum well stack 130 generally comprises a substrate region 133, a quantum well region 134, and a thin surface layer 135. The substrate region 133 may be made of a highly doped GaAs substrate material, and may be etched from a bulk substrate layer of a quantum well wafer as described below. The quantum well region 134 comprises alternating quantum well layers and barrier layers. The quantum well layers may comprise doped indium gallium arsenide (InGaAs) and/or doped GaAs, while the barrier layers may comprise unintentionally doped aluminum gallium arsenide (AlGaAs) (i.e., AlGaAs having unintentional dopants). In another embodiment, the quantum well stack 130 may only comprise the quantum well region 134 and not the substrate region 133 illustrated in FIG. 1. The thin surface layer 135 may comprise highly doped GaAs. In another embodiment, the quantum well stack 130 may not have a thin surface layer 135 such that the quantum well region 134 extends to a peak of the quantum well stack 130.

A backside electrical contact 140 is connected to a peak surface 132 of the quantum well stack 130. Although not illustrated, an insulator layer may be located on the facets as well as adjacent to the backside electrical contact 140 on the peak surface 132. The backside electrical contact 140 may be made of an electrically conductive metal (e.g., gold), and provides an electrical connection of the quantum well stack 130 to the ROIC assembly 160. As described in more detail below, the quantum well stack 130 and associated backside electrical contact 140 may be connected to an electrical contact 162 of the ROIC assembly 160 via an indium bonding bump 150. In a focal plane array, the backside electrical contacts 140 of each individual quantum well stack 130 are connected to the ROIC assembly 160, such that the plurality of frontside common electrical contacts 120, quantum well stacks 130, and backside electrical contacts 140 define a plurality of individual pixels that may be read by ROIC assembly 160.

The ROIC assembly 160 may comprise a ROIC substrate having a ROIC located thereon. The ROIC may be configured to receive the photon-excited currents from the quantum well pixels and either perform signal processing to produce an infrared image or pass the photon-excited currents as signals and/or data to an additional circuit(s) or external device for signal processing.

Still referring to FIG. 1, infrared radiation 170', 170" enters the QWIP focal plane array 100 through the transparent substrate 122 and is reflected by the facets 131. The alternating quantum well and barrier layers of the quantum well region 134 have alternating levels in conduction and valence energy bands. The conduction band in the quantum well layer material has low energy wells separated by high energy barriers in the barrier layers. Electrons accumulate in the quantum wells due to dopants, and a photon of sufficient energy can elevate an electron out of the well and above the barrier. Electrons may be elevated over the conduction barrier by either photon absorption or thermal excitation. Photon elevated electrons constitute the photocurrent while thermally excited electrons constitute dark current.

The infrared radiation 170', 170" has electric field vectors that are normal to the direction of propagation. To promote electrons within the quantum well region 134 by photon absorption, the electric field vectors should point normal to the quantum well and barrier layers within the quantum well region 134. Therefore, the infrared radiation should be reflected such that its propagation direction is relatively in the plane of the quantum well and barrier layers and the corresponding electric field vector is relatively perpendicular to the quantum well and barrier layers. As illustrated in FIG. 1, infrared radiation, illustrated by arrows 170', 170" enter the transparent substrate 122 and is reflected such that the direction of propagation (illustrated by arrows 172', 172") is in the plane of the quantum well and barrier layers of the quantum well region 134. It should be understood that the infrared radiation may not be reflected in a direction that is perfectly parallel to the quantum well and barrier layers and that it may be reflected in other directions.

Figure 2:
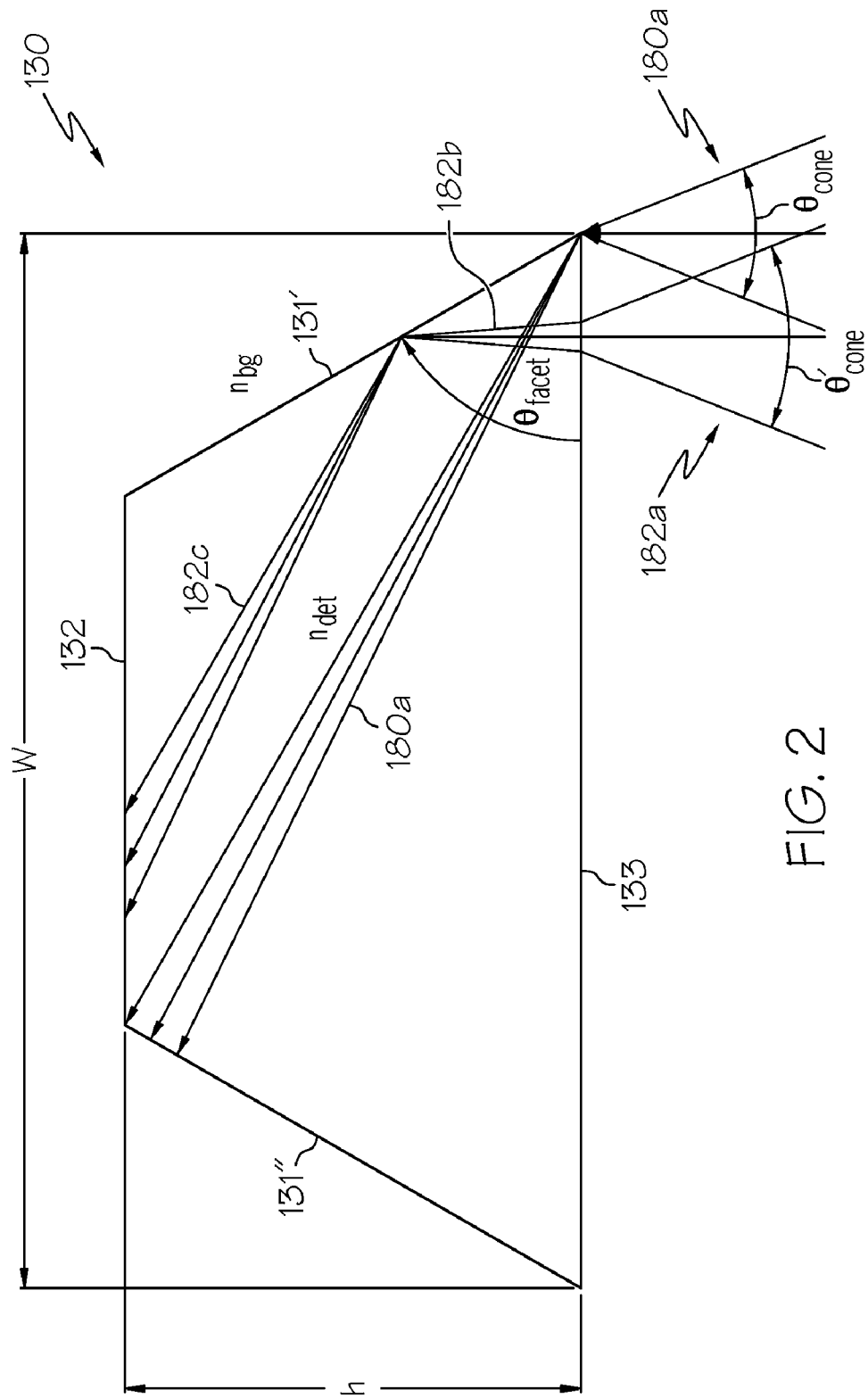
FIG. 2 depicts a schematic illustration of radiation propagation within a quantum well stack according to one or more embodiments described and illustrated herein.

FIG. 2 illustrates an embodiment of a quantum well stack 130 having a width w and a height h. To achieve efficient photon absorption within the quantum well stack 130, the facets 131 should ensure total or near total internal reflection of infrared radiation off of each facet 131. As illustrated by FIG. 2, the infrared radiation 180a and 182a is incident on an input face of the quantum well stack 130 through a cone angle defined by radiation-coupling optics (not shown). It should be understood that the infrared radiation is illustrated as cones 180a and 182a for illustrative purposes only. The geometric properties of the cone angle may depend on the radiation-coupling optics used to couple the infrared radiation into the IQWIP focal plane array, as well as the particular application in which the IQWIP focal plane array is desired to operate.

The infrared radiation 180a and 182a enters the quantum well stack 130 and is reflected by facet 131'. Because material of the quantum well stack 130 has a higher index of refraction ($\eta_{det}$) than the index of refraction of the background material ($\eta_{bg}$) (air or vacuum), the internal cone angle is smaller (illustrated as cones 180b and 182b, respectively) than the cone angle of the radiation prior to entering the quantum well stack 130. Additionally, the internal cone angle is bound by the critical angle, as described below.

If the facet angle $\theta_{facet}$ is bounded by $$\theta_c + \frac{\theta_{cone}}{2} < \theta_{facet} < 60° - \frac{\theta_c}{3} - \frac{\theta_{cone}}{6},$$

then the total internal reflection occurs off all facets for an arbitrary detector height h and cone angle $\theta_{cone}$.

where:

$\eta_{bg}$ is the index of refraction of the background material (vacuum), $\eta_{det}$ is the index of refraction of the quantum well stack material, and $\theta_c$ is the critical angle, wherein $$\theta_c = \sin^{-1}\left(\frac{\eta_{bg}}{\eta_{det}}\right),$$

The only constraint on h is by geometry, i.e. from the law of sines:

$$0 < h \le W \cdot \frac{\sin^2(\theta_{facet})}{\sin(180° - 2 \cdot \theta_{facet})}.$$

If the facet angles are in the range of $$60° - \frac{\theta_c}{3} - \frac{\theta_{cone}}{6} < \theta_{facet} < 60° + \frac{\theta_c}{3} + \frac{\theta_{cone}}{6},$$

then total internal reflection occurs at all facets only when h is constrained. The narrower the cone angle, the larger h may be. Quantum well stack 130 height h may be defined as:

$$h \le W \cdot \frac{\sin(\theta_{facet}) \cdot \sin\left(90° - \theta_{facet} - \frac{\theta_{cone}}{2}\right)}{\sin\left(90° + \frac{\theta_{cone}}{2}\right)}$$

for

-continued $$60° - \frac{\theta_c}{3} - \frac{\theta_{cone}}{6} < \theta_{facet} \leq 60° - \frac{\theta_c}{3} + \frac{\theta_{cone}}{6};$$

$$h \leq W \cdot \frac{\sin(\theta_{facet}) \cdot \sin\left(2 \cdot \theta_{facet} - \frac{\theta_{cone}}{2} - 90°\right)}{\sin\left(270° - 3 \cdot \theta_{facet} + \frac{\theta_{cone}}{2}\right)}$$

for $$60° - \frac{\theta_c}{3} + \frac{\theta_{cone}}{6} < \theta_{facet} \leq 60° + \frac{\theta_c}{3} + \frac{\theta_{cone}}{6}.$$

The frontside illuminated design illustrated in FIG. 1 provides for a detector device that does not require an epoxy backfill to withstand mechanical forces that the device may experience during operation due to cryogenic cooling cycles. The coefficient of thermal expansion of the transparent substrate 122 may be substantially similar to that of the ROIC assembly 160 substrate to withstand temperature cycle extremes. Further, because embodiments may not utilize an epoxy backfill material, complicated mirror structures are not required to be positioned on the facets 131 to provide internal reflection of the infrared radiation within the quantum well stacks 130.

Methods of fabricating embodiments of the IQWIP focal plane array 100 and focal plane arrays described above will now be described in detail. Referring to FIGS. 3A and 3B, a quantum well wafer 110 having a bulk substrate layer 112 made of GaAs and a quantum material layer 114 made of alternating quantum well layers and barrier layers is illustrated. The quantum well layers and barrier layers may be epitaxially grown on the bulk substrate layer 112 during fabrication of the quantum well wafer 110. The quantum material layer may have a total thickness that is dictated by the height of the detector and the thickness of the contact layers. It should be understood that any number of quantum well and barrier layers may be utilized. In one embodiment, as illustrated in FIG. 3A, a thin surface layer 115 of GaAs may be grown on the quantum material layer 114. The thin surface layer 115 may be a highly-doped band gap material that does not absorb radiation in the infrared range. The thin surface layer 115 may be a few hundred Angstroms in thickness. In other embodiments, the quantum well wafer 110 may not include the thin surface layer 115.

Referring now to FIGS. 4A and 4B, frontside common electrical contacts 120 are applied to a frontside of the quantum well wafer 110. The frontside of the quantum well wafer 110 is the side having the quantum material layer 114 or the thin surface layer 115. The frontside common electrical contacts 120 may be configured as a metal grid made of a conductive material, such as gold, for example, and may be applied using a liftoff process and an ohmic anneal.

Depending on the configuration of the quantum well wafer 110, the frontside common electrical contacts 120 provide an electrical contact with either the thin surface layer 115 or the quantum material layer 114. As the frontside common electrical contacts 120 are all electrically connected in a grid formation, they provide a reference potential for the IQWIP device, such as ground.

Referring now to FIGS. 5A and 5B, a transparent substrate 122 is bonded to the frontside of the quantum well wafer 110 using an adhesive bonding layer 116. The transparent substrate 122 is made of a material that is substantially transparent to radiation in the infrared spectral range, such as float zone silicon, for example. In one embodiment, an anti-reflective layer 124 may be applied to the transparent substrate 122 (see FIG. 1). Prior to mounting the transparent substrate 122 to the quantum well wafer 110, the quantum well wafer 110 and/or the transparent substrate 122 may be cleaned using solvents, de-ionized water rinse or an $O_2$ plasma cleaning process.

The transparent substrate 122 may be bonded to the frontside of the quantum well wafer 110 (and frontside common electrical contacts 120) using an adhesive bonding layer 116. The adhesive material may be an epoxy that has negligible absorption of radiation in the predetermined wavelength range (e.g., infrared or near-infrared).

Figure 6B:
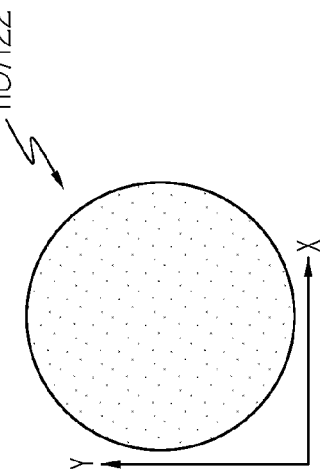
FIGS. 6A and 6B depict a schematic illustration of the quantum well wafer and transparent substrate illustrated in FIGS. 5A and 5B after a bulk substrate thinning process according to one or more embodiments described and illustrated herein.
Figure 6A:
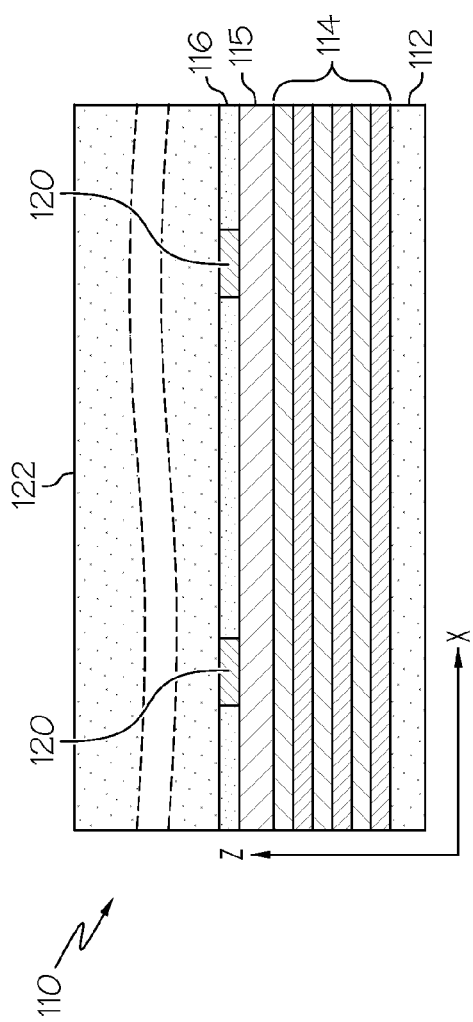

FIGS. 6A and 6B illustrate a quantum well wafer 110 and transparent substrate 122 assembly after a thinning of the bulk substrate layer 112. FIG. 6A illustrates an embodiment in which a portion of the bulk substrate layer 112 remains after the thinning process. In this embodiment, a portion of the GaAs bulk substrate layer 112 will be present in the etched quantum well stacks/pixels 130. Enough of the bulk substrate layer 112 should be removed to more easily etch the substrate, but not so much that causes damage to the device. In another embodiment, a majority of the bulk substrate layer 112 is removed such that the later-formed quantum well stacks consist primarily of the quantum well region 134.

The bulk substrate layer 112 of the quantum well wafer 110 may be first thinned mechanically, such as by the application of a milling or grinding device, for example. The bulk substrate layer 112 may be further thinned by a chemical process using a wet etchant solution, such as a solution of $H_3PO_4$—$H_2O_2$—$H_2O$ or a solution of $H_2SO_4$—$H_2O_2$—$H_2O$, until a desired thickness is achieved. Other known and yet-to-be-developed thinning processes may also be utilized.

Referring now to FIGS. 7A and 7B, the remaining quantum material layer 114 and/or bulk substrate layer 112 as illustrated in FIG. 6A is etched to form a plurality of pyramidal quantum well stacks 130, each having four facets 131. In one embodiment, a patterned etch mask (not shown) is applied to a backside of the thinned quantum well wafer 110. The patterned etch mask may comprise a photoresist material, a dielectric material, a metal material, and/or any material capable of resisting the etching material during the etching process. A majority of the quantum material layer 114 and/or bulk substrate layer 112 may be removed during a dry etching process, such as a plasma etch process. The dry etch process reticulates the backside of the quantum well wafer 110 to form the plurality of individual quantum well stacks 130, each having the desired facet geometry described above. At least a portion of the quantum well stacks 130 may be fully electrically isolated from one another by reticulation. In one embodiment, the dry etch process may be followed by a wet etch process in which an etching solution is applied to the backside of the quantum well wafer 110 to finely remove additional material to achieve quantum well stacks 130 that meet particular fabrication requirements. Exemplary etchant solutions may include, but are not limited to, a solution of $H_3PO_4$—$H_2O_2$—$H_2O$ or a solution of $H_2SO_4$—$H_2O_2$—$H_2O$. Ion beam milling may also be utilized to fabricate the quantum well stacks 130.

As illustrated in FIGS. 7A and 7B, each quantum well stack 130 may have a thin surface GaAs layer 135 formed of the thin surface layer 115 material, a quantum well region 134 formed of the quantum material layer 114, and a bulk substrate material region 133 formed of the bulk substrate layer 112. In other embodiments, the quantum well stacks 130 may consist only of the quantum well region 134, only the thin surface GaAs layer 135 and the quantum well region 134, or only the quantum well region 134 and the bulk substrate material region 133.

The number of quantum well stacks 130 formed may depend on the particular application in which the completed device will operate. As an example and not a limitation, a 1024×1024 pixel IQWIP focal plane array was fabricated using the processes described herein. It should be understood that larger and smaller focal plane arrays may be fabricated.

The quantum well wafer 110 may then be cleaned using an acetone wash and/or an $O_2$ plasma de-scum process. The patterned etch mask may be removed from the backside of the quantum well wafer 110.

Referring now to FIGS. 8A and 8B, a backside electrical contact 140 is applied to each quantum well stack 130. The backside electrical contacts 140 may be made of an electrically conductive material, and may be applied via a liftoff process or any other known or yet-to-be-developed process for depositing metal material onto a substrate. The frontside common electrical contact 120, quantum well stack 130, and backside electrical contact 140 define an individual pixel of the IQWIP device. As described below, the backside electrical contacts 140 electrically couple each individual quantum well stack 130 to the ROIC assembly.

Figure 8C:
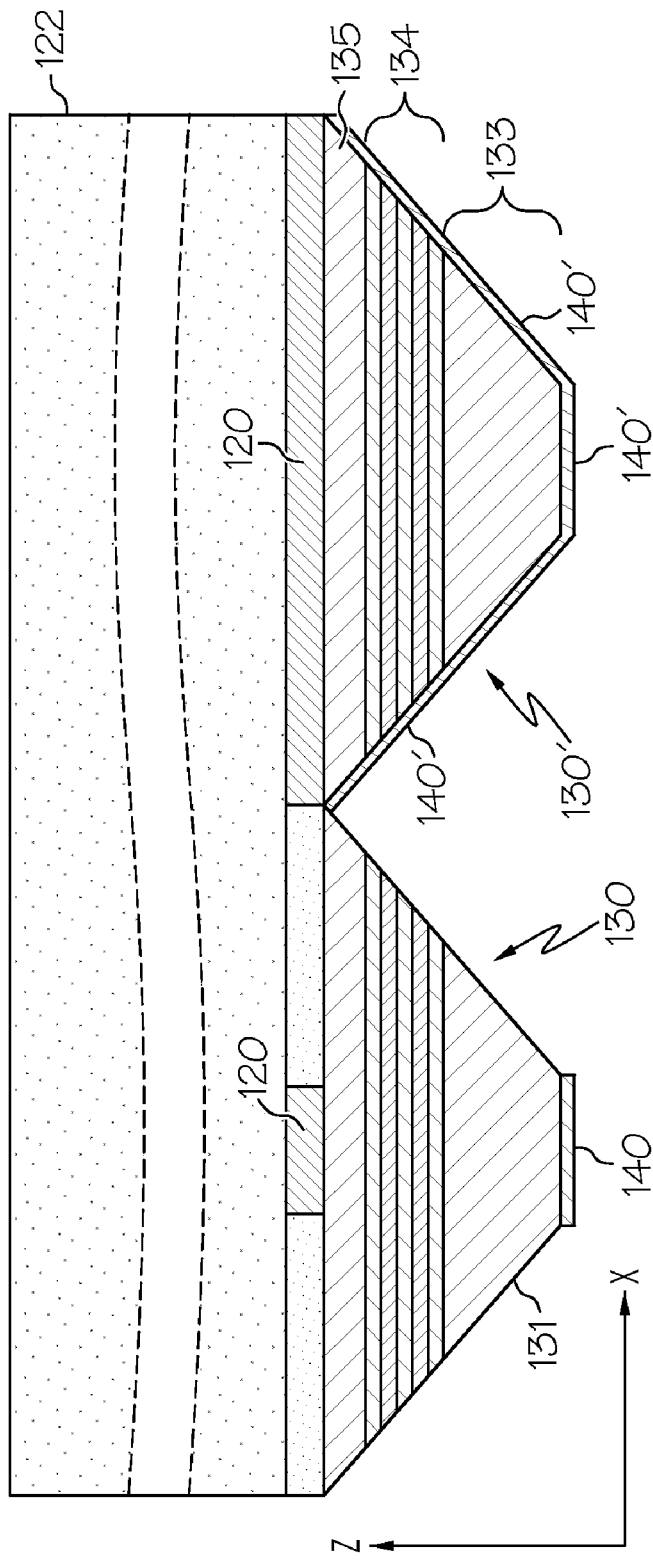
FIG. 8C depicts a schematic illustration of a ground pixel according to one or more embodiments described and illustrated herein.

Referring to FIG. 8C, in one embodiment, ground pixels (e.g., ground pixel 130') may be utilized to electrically couple the frontside electrical contacts 120 to the ROIC assembly. A ground pixel 130' is a pixel that is electrically shorted by an electrical connection between a backside electrical contact 140' and the frontside electrical contacts 120. As described above, the frontside electrical contacts 120 may comprise a metal grid that is overlaid on a frontside of the quantum well stacks. As illustrated in FIG. 8C, the backside electrical contact 140' of the ground pixel 130' may extend over at least a portion of the ground pixel 130' such that it makes electrical contact with the frontside electrical contact 120. The backside electrical contact 140' may extend over one or more of the facets 131 of the ground pixel 130'. In this manner, the quantum well region 134 is bypassed and the pixel is shorted to the reference potential of the frontside electrical contacts 120 (e.g., a ground reference potential). This backside electrical contact 140' configuration enables electrical current to bypass the quantum well active regions 134 of the ground pixels 130'. In one embodiment, ground pixels 130' are located at a perimeter of the array of quantum well pixels. In another embodiment, only one ground pixel is used to electrically couple the array of quantum well pixels to the ROIC assembly.

After applying the backside electrical contacts 140, the quantum well wafer 110 and transparent substrate 122 may be singulated into one of more quantum well infrared photodetector arrays 118 (i.e., IQWIP devices). As illustrated in FIGS. 9A and 9B, excess quantum well wafer 110 and transparent substrate 122 may be trimmed to form the quantum well infrared photodetector array 118. One or more IQWIP devices may be singulated from the quantum well wafer 110 and transparent substrate 122 assembly. The quantum well wafer 110 and transparent substrate 122 assembly may be singulated by the application of a dicing or sawing mechanism.

Figure 10:
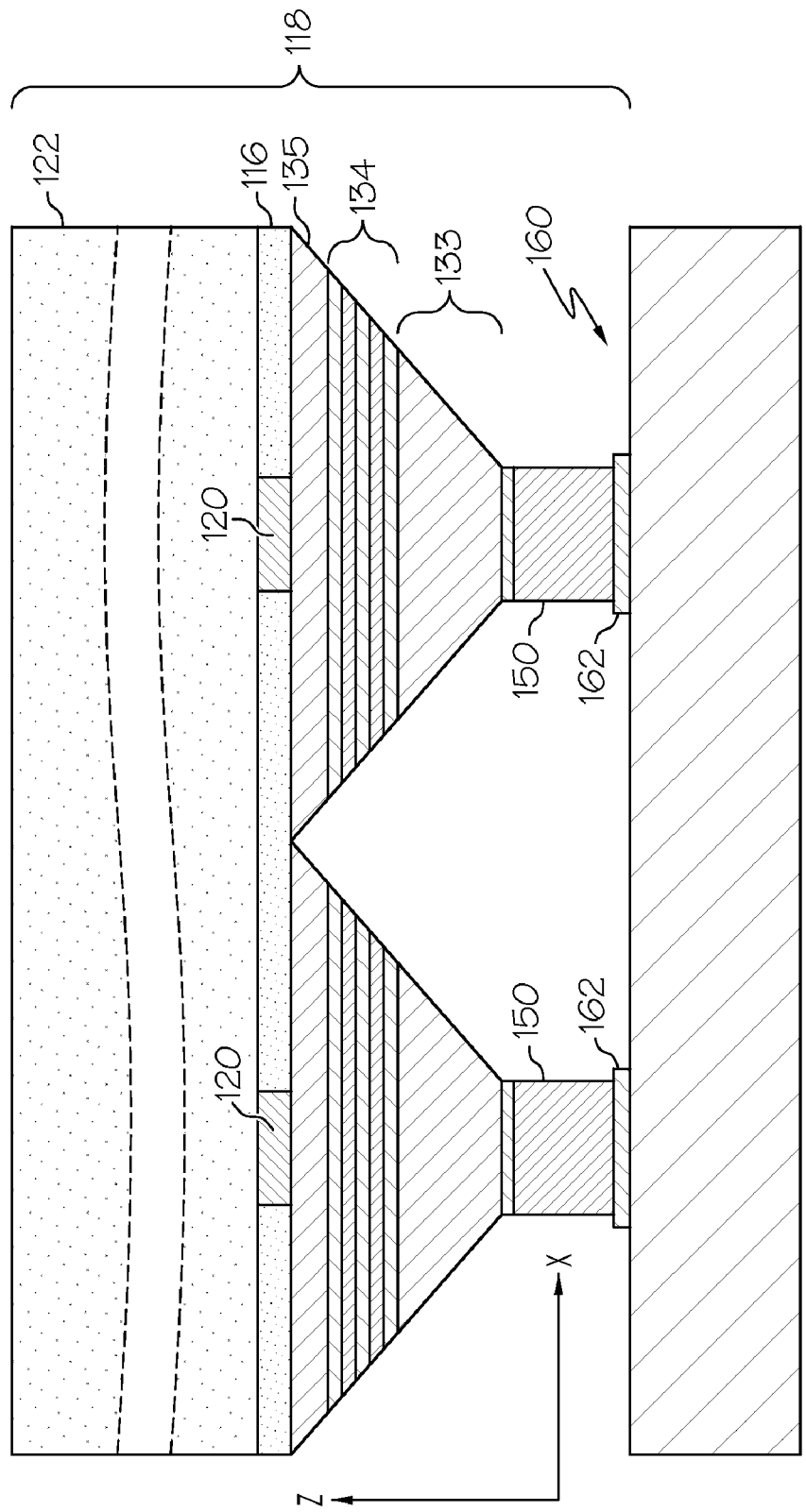
FIG. 10 depicts a schematic illustration of the inverted quantum well infrared photo detector illustrated in FIGS. 9A and 9B bonded to a read-out integrated circuit assembly according to one or more embodiments described and illustrated herein.

Referring to FIG. 10, the quantum well infrared photodetector array 118 may be hybridized to a ROIC assembly 160 to complete the fabrication of an IQWIP focal plane array 100. The phrase focal plane array is used to refer to particular IQWIP device having a quantum well infrared photodetector array 118 that is coupled to a ROIC assembly 160. It should be understood that the quantum well infrared photodetector arrays 118 described herein may be incorporated into infrared detector devices other than focal plane arrays.

The quantum well infrared photodetector array 118 may be bump-bonded to the ROIC assembly 160 using bonding bumps 150, which may be made of indium, for example. The ROIC assembly 160 has a plurality of electrical contacts 162 that are arranged to align with the backside electrical contacts 140 of the quantum well infrared photodetector array 118. A bonding bump 150 may be applied to the backside electrical contacts 140 and/or the electrical contacts 162 via a liftoff process or other known or yet-to-be-developed process. The quantum well infrared photodetector array 118 may then be positioned on the ROIC assembly 160 such that the backside electrical contacts 140 are aligned with the electrical contacts 162, and then pressed to bond the two components together. Heat may also be applied during bonding to improve the bond strength of the device interconnects. The completed IQWIP focal plane array 100 may then be inspected.

In one embodiment, additional filter layers may be applied to the transparent substrate 122 to condition the incoming infrared radiation. For example, a polarizer layer and/or a spectral filter layer may be applied to the transparent substrate 122.

In the embodiments described above, the quantum well layers and barrier layers of the quantum well stacks are located closer to the incoming infrared radiation than in conventional quantum well infrared detector devices, thereby increasing the quantum efficiency of the device. Further, the facet design provides for a large active quantum well region resulting in increased quantum efficiency. Because the individual pixels may be fully reticulated and isolated, cross talk between the pixels is limited.

For the purposes of describing and defining the present invention it is noted that the terms "approximately" and "substantially" are utilized herein to represent the inherent degree of uncertainty that may be attributed to any quantitative comparison, value, measurement, or other representation. The terms "approximately" "substantially" are also utilized herein to represent the degree by which a quantitative representation may vary from a stated reference without resulting in a change in the basic function of the subject matter at issue.

The foregoing description of the various embodiments of the invention has been presented for the purposes of illustration and description. It is not intended to be exhaustive or to limit the invention to the precise steps and/or forms disclosed. Many alternatives, modifications and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the inventions as defined by the claims.

What is claimed is:

1. A method of fabricating a frontside-illuminated inverted quantum well infrared photodetector focal plane array, the method comprising:
    providing a quantum well wafer comprising a bulk substrate layer and a quantum material layer comprising a plurality of alternating quantum well layers and barrier layers, wherein the alternating quantum well layers and barrier layers have been epitaxially grown on the bulk substrate layer, the quantum material layer is on a frontside of the quantum well wafer, and the bulk substrate layer is on a backside of the quantum well wafer;
    applying a plurality of frontside common electrical contacts to the frontside of the quantum well wafer;

bonding a transparent substrate to the frontside of the quantum well wafer and the plurality of frontside common electrical contacts, wherein the transparent substrate is transparent to radiation in a predetermined wavelength range;

thinning the bulk substrate layer of the quantum well wafer;

etching the quantum material layer to form a plurality of quantum well facets that define a plurality of pyramidal quantum well stacks;

applying a backside electrical contact to each pyramidal quantum well stack to form a plurality of pixels, wherein the pixels are at least partially reticulated;

singulating the quantum well wafer and the transparent substrate into at least one quantum well infrared photodetector array; and bump bonding the backside electrical contacts of the at least one quantum well infrared photodetector array to a read-out integrated circuit assembly, wherein the read-out integrated circuit assembly comprises a read-out integrated circuit assembly bulk substrate that has a coefficient of thermal expansion that is substantially equal to the coefficient of thermal expansion of the transparent substrate.

2. The method as claimed in claim 1, wherein the bulk substrate layer comprises highly doped gallium arsenide (GaAs).

3. The method as claimed in claim 1, wherein the quantum well layers comprise doped indium gallium arsenide (InGaAs), gallium arsenide (GaAs) or combinations thereof, and the barrier layers comprise unintentionally doped aluminum gallium arsenide (AlGaAs).

4. The method as claimed in claim 1, wherein the frontside of the quantum well wafer is bonded to the transparent substrate with an adhesive bonding layer.

5. The method as claimed in claim 1, wherein the bulk substrate layer is mechanically thinned.

6. The method as claimed in claim 1, wherein the bulk substrate layer is chemically thinned.

7. The method as claimed in claim 6, wherein the bulk substrate layer is chemically thinned using a wet etchant comprising a solution of $H_3PO_4$—$H_2O_2$—$H_2O$ or a solution of $H_2SO_4$—$H_2O_2$—$H_2O$.

8. The method as claimed in claim 1, wherein etching the quantum material layer to form the plurality of quantum well facets further comprises:

applying a patterned etch mask to the quantum material layer, wherein the patterned etch mask comprises a photo resist material, a dielectric material, a metal material, or combinations thereof;

performing a dry etch process to the patterned etch mask and the quantum material layer;

applying an etching solution to the patterned etch mask and the quantum material layer; and removing the patterned etch mask from the quantum material layer.

9. The method as claimed in claim 1, wherein the plurality of frontside common electrical contacts is configured as a metal grid.

10. The method as claimed in claim 1, wherein individual ones of the plurality of quantum well facets have sidewall angles between about 45 and about 60 degrees relative the transparent substrate.

11. The method as claimed in claim 1, further comprising applying to the transparent substrate an anti-reflective layer, a spectral filter layer, a polarizer layer, or combinations thereof.

12. A method of fabricating a frontside-illuminated inverted quantum well infrared photodetector, the method comprising:

providing a quantum well wafer comprising a bulk substrate layer and a quantum material layer comprising a plurality of alternating quantum well layers and barrier layers, wherein the alternating quantum well layers and barrier layers have been epitaxially grown on the bulk substrate layer, the quantum material layer is on a frontside of the quantum well wafer, and the bulk substrate layer is on a backside of the quantum well wafer;

applying at least one frontside common electrical contact to the frontside of the quantum well wafer;

bonding a transparent substrate to the frontside of the quantum well wafer and the frontside common electrical contact;

thinning the bulk substrate layer of the quantum well wafer;

etching the quantum material layer to form quantum well facets that define at least one pyramidal quantum well stack; and applying a backside electrical contact to the at least one pyramidal quantum well stack to form at least one reticulated pixel.

13. The method as claimed in claim 12, wherein the quantum well layers comprise doped indium gallium arsenide (InGaAs), gallium arsenide (GaAs) or combinations thereof, and the barrier layers comprise unintentionally doped aluminum gallium arsenide (AlGaAs).

14. The method as claimed in claim 12, wherein the bulk substrate layer is mechanically thinned.

15. The method as claimed in claim 12, wherein the bulk substrate layer is chemically thinned.

16. The method as claimed in claim 15, wherein the bulk substrate layer is chemically thinned using a wet etchant comprising a solution of $H_3PO_4$—$H_2O_2$—$H_2O$ or a solution of $H_2SO_4$—$H_2O_2$—$H_2O$.

17. The method as claimed in claim 12, wherein the quantum well facets have sidewall angles of between 45 and 60 degrees relative to the transparent substrate.

* * * * *